(12) United States Patent
Shimizu

(10) Patent No.: US 11,269,019 B2
(45) Date of Patent: Mar. 8, 2022

(54) VOLTAGE DETECTION APPARATUS

(71) Applicant: DENSO CORPORATION, Kariya (JP)

(72) Inventor: Takumi Shimizu, Kariya (JP)

(73) Assignee: DENSO CORPORATION, Kariya (JP)

(*) Notice: Subject to any disclaimer, the term of this patent is extended or adjusted under 35 U.S.C. 154(b) by 22 days.

(21) Appl. No.: 16/784,447

(22) Filed: Feb. 7, 2020

(65) Prior Publication Data

US 2020/0271732 A1 Aug. 27, 2020

(30) Foreign Application Priority Data

Feb. 25, 2019 (JP) .............................. JP2019-032142

(51) Int. Cl.
*G01R 31/64* (2020.01)
*G01R 19/165* (2006.01)
*H01M 10/48* (2006.01)
*G01R 31/396* (2019.01)
*G01R 31/3835* (2019.01)

(52) U.S. Cl.
CPC .......... *G01R 31/64* (2020.01); *G01R 19/165* (2013.01); *G01R 31/3835* (2019.01); *G01R 31/396* (2019.01); *H01M 10/482* (2013.01)

(58) Field of Classification Search
CPC .... G01R 31/64; G01R 19/165; G01R 31/396; G01R 31/3835; G01R 19/16542; G01R 19/16576; H01M 10/482; Y02E 60/10
See application file for complete search history.

(56) References Cited

U.S. PATENT DOCUMENTS

| | | | | |
|---|---|---|---|---|
| 5,510,719 A | * | 4/1996 | Yamamoto | G01R 31/64 324/548 |
| 6,268,710 B1 | * | 7/2001 | Koga | H02J 7/0021 320/116 |
| 2007/0115006 A1 | * | 5/2007 | Anude | G01R 31/016 324/678 |
| 2008/0164882 A1 | * | 7/2008 | Jaeger | G01R 31/396 324/434 |

(Continued)

FOREIGN PATENT DOCUMENTS

| | | |
|---|---|---|
| JP | H09-229976 A | 9/1997 |
| JP | 2002-315212 A | 10/2002 |

(Continued)

*Primary Examiner* — Daniel R Miller
(74) *Attorney, Agent, or Firm* — Oliff PLC

(57) ABSTRACT

A voltage detection apparatus for an assembled battery includes: a capacitor; input-side switches provided between the capacitor and detection targets each including at least one battery cell; a voltage detection unit configured to detect the voltage of the capacitor; output-side switches provided between the capacitor and the voltage detection unit; a capacitor charging unit configured to charge the capacitor using a specific detection target; a first-voltage acquiring unit configured to acquire a first voltage which is the voltage of the capacitor after the passage of a first period from the charging of the capacitor; a second-voltage acquiring unit configured to acquire a second voltage which is the voltage of the capacitor after the passage of a second period from the acquisition of the first voltage; and a fault determining unit configured to determine, based on the acquired first and second voltages, whether a leak fault has occurred in the capacitor.

5 Claims, 8 Drawing Sheets

(56) References Cited

U.S. PATENT DOCUMENTS

2009/0134881 A1    5/2009   Tachizaki
2012/0153966 A1    6/2012   Kawamura

FOREIGN PATENT DOCUMENTS

| JP | 2004-170146 A | 6/2004 |
| JP | 2005-091224 A | 4/2005 |
| JP | 2005-292137 A | 10/2005 |
| JP | 2009-053133 A | 3/2009 |
| JP | 2009-210480 A | 9/2009 |
| JP | 2017-156297 A | 9/2017 |

\* cited by examiner

VOLTAGE DETECTION APPARATUS

CROSS-REFERENCE TO RELATED APPLICATION

This application is based on and claims priority from Japanese Patent Application No. 2019-032142 filed on Feb. 25, 2019, the contents of which are hereby incorporated by reference in their entirety into this application.

BACKGROUND

1 Technical Field

The present disclosure relates to a voltage detection apparatus for an assembled battery that has a plurality of battery cells electrically connected in series with each other.

2 Description of Related Art

There is known a double flying-capacitor type voltage detection apparatus that detects, using two capacitors, the voltage of each of detection targets into which a plurality of battery cells are divided. More specifically, each of the detection targets includes at least one of the battery cells. The two capacitors are used to acquire the voltages of different ones of the detection targets at the same time. Moreover, the voltage detection apparatus further determines, based on the acquired voltages of the detection targets, whether a leak fault has occurred in either of the two capacitors.

SUMMARY

According to the present disclosure, there is provided a voltage detection apparatus for an assembled battery. The assembled battery has a plurality of battery cells electrically connected in series with each other. The battery cells are divided into a plurality of detection targets. Each of the detection targets includes at least one of the battery cells. The voltage detection apparatus includes a capacitor, input-side switches, a voltage detection unit, output-side switches, a capacitor charging unit, a first-voltage acquiring unit, a second-voltage acquiring unit and a fault determining unit. The input-side switches are provided to parallel connect the detection targets to the capacitor and open and close electrical paths between the detection targets and the capacitor. The voltage detection unit is configured to detect the voltage of the capacitor. The output-side switches are provided to open and close electrical paths between the capacitor and the voltage detection unit. The capacitor charging unit is configured to turn the output-side switches to an open state and those of the input-side switches which correspond to a specific detection target to a closed state and thereby charge the capacitor with electric power stored in the specific detection target. The specific detection target is one of the plurality of detection targets. The first-voltage acquiring unit is configured to turn, after the charging of the capacitor by the capacitor charging unit, the input-side switches corresponding to the specific detection target to an open state and the output-side switches to a closed state and thereby acquire a first voltage. The first voltage is the voltage of the capacitor after a first period has elapsed from the turning of the input-side switches corresponding to the specific detection target to the open state. The second-voltage acquiring unit is configured to acquire a second voltage. The second voltage is the voltage of the capacitor after a second period has elapsed from the acquisition of the first voltage by the first-voltage acquiring unit. The fault determining unit is configured to determine, based on the first voltage acquired by the first-voltage acquiring unit and the second voltage acquired by the second-voltage acquiring unit, whether a leak fault has occurred in the capacitor.

DESCRIPTION OF EMBODIMENTS

Figure 1:
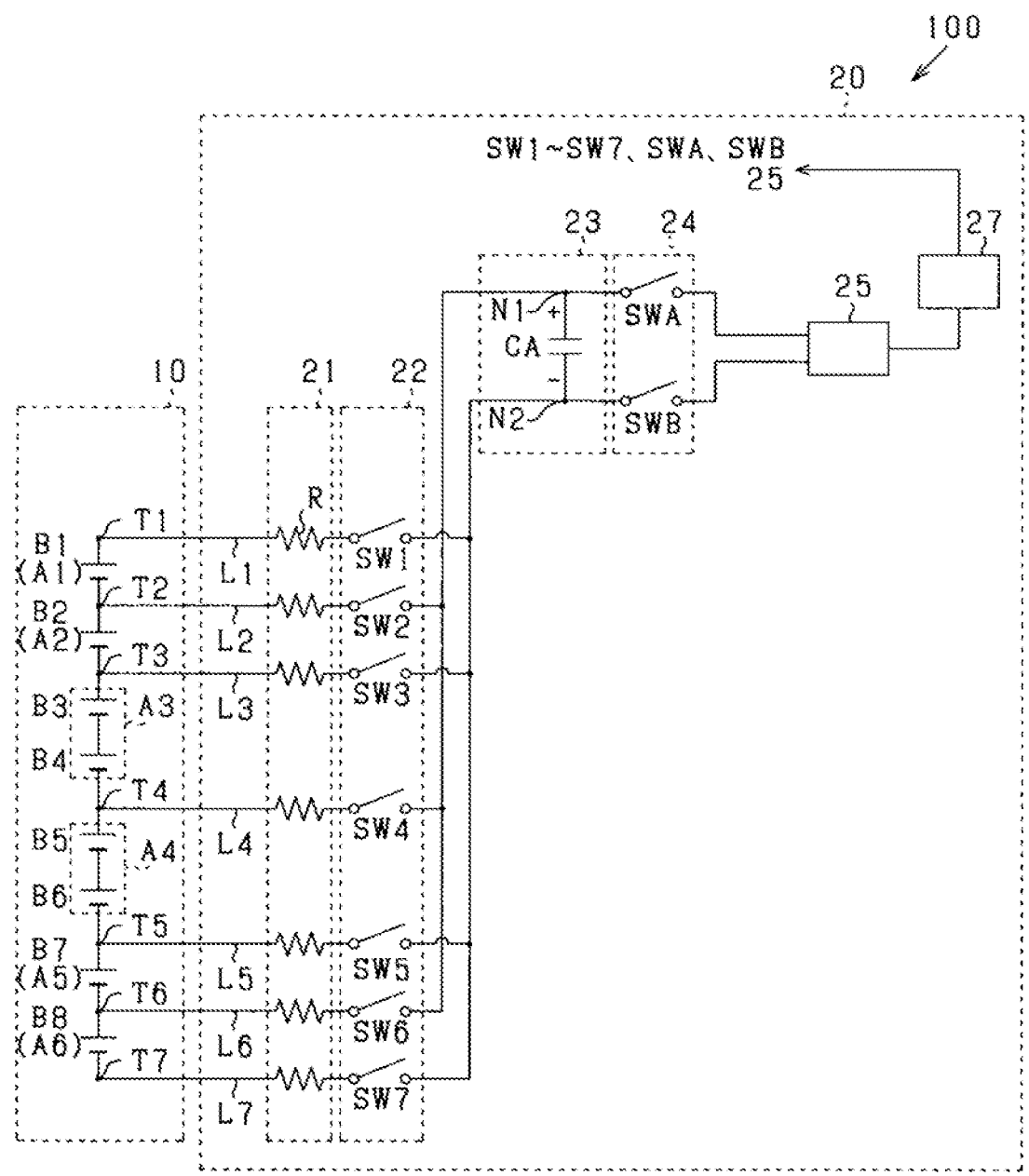
FIG. 1 is a schematic diagram illustrating the overall configuration of an electric power supply system which includes a voltage detection apparatus according to a first embodiment.

As flying-capacitor type voltage detection apparatuses, there is also known a single flying-capacitor type voltage detection apparatus in addition to the above-described double flying-capacitor type voltage detection apparatus known in the art (see, for example, Japanese Patent Application Publication No. JP2017156297A). Unlike the double flying-capacitor type voltage detection apparatus, the single flying-capacitor type voltage detection apparatus includes only a single capacitor. Therefore, it is impossible for the single flying-capacitor type voltage detection apparatus to acquire the voltages of two different detection targets at the same time. Consequently, it is impossible for the single flying-capacitor type voltage detection apparatus to detect a leak fault of the single capacitor using the same method as described in Japanese Patent Application Publication No. JP2017156297A.

In contrast, in the above-described voltage detection apparatus according to the present disclosure, the voltage of the capacitor, which has been charged with electric power stored in the specific detection target, is acquired twice at different timings respectively as the first voltage and the second voltage. Then, based on the acquired first and second voltages, it is determined whether a leak fault has occurred in the capacitor. That is, the leak fault determination is made for the capacitor using the capacitor itself. Consequently, it becomes possible to suitably make the leak fault determination for the capacitor even if the voltage detection apparatus includes only the single capacitor.

In further implementations, the voltage detection apparatus may further include a switch-state control unit that is configured to turn the output-side switches to the open state during the second period from the acquisition of the first voltage by the first-voltage acquiring unit to the acquisition of the second voltage by the second-voltage acquiring unit.

With the above configuration, it is possible to suppress discharge from the capacitor to the voltage detection unit side during the second period. That is, any discharge from the capacitor other than leak discharge can be suppressed. Consequently, it becomes possible to accurately determine whether a leak fault has occurred in the capacitor.

In the voltage detection apparatus, the fault determining unit may be configured to determine, when a voltage difference between the first voltage acquired by the first-voltage acquiring unit and the second voltage acquired by the second-voltage acquiring unit is larger than a preset threshold value, that a leak fault has occurred in the capacitor. The threshold value may be preset based on at least one of the first voltage acquired by the first-voltage acquiring unit and the second period.

When a leak fault has occurred in the capacitor, the higher the first voltage and the longer the second period, the larger the amount of leak discharge from the capacitor per unit time and thus the larger the voltage difference between the first and second voltages. Therefore, presetting the threshold value, which is used in the leak fault determination for the capacitor, based on at least one of the first voltage and the second period, it is possible to more accurately make the leak fault determination for the capacitor than in the case of presetting the threshold value to a constant value regardless of the first voltage and the second period Y2.

The voltage detection apparatus may further include a detection-target voltage acquiring unit that is configured to acquire the voltage of the specific detection target based on the first voltage acquired by the first-voltage acquiring unit.

With the above configuration, the voltage of the specific detection target is acquired (or determined) based on the first voltage that has been acquired for making the leak fault determination for the capacitor. Therefore, it is unnecessary to further acquire, in addition to the first and second voltages, the voltage of the capacitor for the purpose of acquiring the voltage of the specific detection target. Consequently, it is possible to simplify control of the entire voltage detection apparatus.

Moreover, the voltage detection apparatus may further include a first-period setting unit that is configured to set the first period to be shorter when it is determined by the fault determining unit that a leak fault has occurred in the capacitor than when it is determined that no leak fault has occurred in the capacitor.

When a leak fault has occurred in the capacitor, the shorter the first period, the smaller the amount of leak discharge from the capacitor per unit time and thus the less the influence of the leak fault on the acquired voltage of the specific detection target. Therefore, shortening the first period when it is determined that a leak fault has occurred in the capacitor, it is possible to more accurately acquire the voltage of the specific detection target; thus it is also possible to more accurately estimate the SOC of the specific detection target on the basis of the acquired voltage of the specific detection target.

The voltage detection apparatus may further include a second-period setting unit that is configured to set the second period to be longer when it is determined by the fault determining unit that a leak fault has occurred in the capacitor than when it is determined that no leak fault has occurred in the capacitor.

When a leak fault has occurred in the capacitor, the longer the second period, the larger the amount of leak discharge from the capacitor per unit time and thus the higher the accuracy of estimation of the leak degree of the capacitor based on the amount of leak discharge. Therefore, lengthening the second period when it is determined that a leak fault has occurred in the capacitor, it is possible to more accurately estimate the leak degree of the capacitor; thus it is also possible to more suitably determine, based on the estimated leak degree, whether it is necessary to replace the capacitor.

Exemplary embodiments will be described hereinafter with reference to the drawings. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of an electric power supply system 100 which includes a voltage detection apparatus 20 according to the first embodiment. The electric power supply system 100 is installed in, for example, a hybrid vehicle or an electric vehicle.

As shown in FIG. 1, in the present embodiment, the electric power supply system 100 includes an assembled battery 10 and the voltage detection apparatus 20 that is of a flying capacitor type.

The assembled battery 10 is an electric power source for supplying electric power to in-vehicle electrical loads which include, for example, a rotating electric machine (not shown) provided for propulsion of the vehicle.

The assembled battery 10 has a plurality of battery cells electrically connected in series with each other. The terminal voltage of the assembled battery is, for example, several hundred volts. The battery cells may be implemented by, for example, storage batteries such as lithium-ion batteries or nickel-metal hydride batteries.

More particularly, in the present embodiment, the assembled battery 10 has a plurality (e.g., eight) of battery modules B electrically connected in series with each other. Each of the battery modules B is formed by integrating at least two battery cells, which are electrically connected in series with each other, into one piece. For the sake of convenience of explanation, hereinafter, the eight battery modules B constituting the assembled battery 10 will be sequentially referred to as the first battery module B1, the second battery module B2, . . . , and the eighth battery module B8 from the highest electric potential side. All the battery modules B1-B8 include the same number of battery cells; thus all the rated voltages of the battery modules B1-B8 are equal to each other.

Moreover, in the present embodiment, the battery modules B1-B8 are divided into first to sixth detection targets A1-A6. Each of the detection targets A1-A6 includes at least one of the battery modules B1-B8. Specifically, the first detection target A1 includes only the first battery module B1. The second detection target A2 includes only the second battery module B2. The third detection target A3 includes both the third and fourth battery modules B3 and B4 that are electrically connected in series with each other. The fourth detection target A4 includes both the fifth and sixth battery modules B5 and B6 that are electrically connected in series with each other. The fifth detection target A5 includes only the seventh battery module B7. The sixth detection target A6 includes only the eighth battery module B8.

In the assembled battery 10, there are provided first to seventh electrode terminals T1-T7. The number of the electrode terminals T1-T7 is greater than the number of the detection targets A1-A6 by one. Moreover, the mth detection target Am has its positive terminal connected with the mth electrode terminal Tm and its negative terminal connected with the (m+1)th electrode terminal T(m+1), where m is an arbitrary integer in the range of 1 to 6.

The voltage detection apparatus 20 has a resistor section 21, an input-side switch section 22, a capacitor section 23, an output-side switch section 24, a voltage detection unit 25 and a control unit 27.

The resistor section 21 is provided between the assembled battery 10 and the input-side switch section 22. The resistor section 21 includes seven current-limiting resistors R each of which is individually provided on a detection line Ln connected with the nth electrode terminal Tn, where n is an arbitrary integer in the range of 1 to 7. The current-limiting resistors R are provided to prevent inrush current from flowing from the assembled battery 10 (i.e., the higher voltage side) to the input-side switch section 22 (i.e., the lower voltage side). The resistances of the current-limiting resistors R are equal to each other.

The input-side switch section 22 is provided between the resistor section 21 and the capacitor section 23. The input-side switch section 22 includes first to seventh switches SW1-SW7 each of which is connected with a corresponding one of the detection lines Ln. Each of the switches SWn of the input-side switch section 22 is provided to connect and disconnect a corresponding one of the electrode terminals Tn to and from the capacitor section 23. In addition, each of the switches SWn may be implemented by, for example, a pair of N-channel MOSFETs having their sources connected with each other, a photo relay or an electric relay.

The capacitor section 23 includes a single capacitor CA. That is, the voltage detection apparatus 20 according to the present embodiment is a single flying-capacitor type voltage detection apparatus. The capacitor CA has first and second terminals N1 and N2 provided as connection terminals. Each of the electrode terminals Tn of the assembled battery 10 is connected with one of the first and second terminals N1 and N2 via a corresponding one of the switches SWn.

Specifically, to the first terminal N1 of the capacitor CA, there are connected the second, fourth and sixth electrode terminals T2, T4 and T6 respectively via the second, fourth and sixth switches SW2, SW4 and SW6. On the other hand, to the second terminal N2 of the capacitor CA, there are connected the first, third, fifth and seventh electrode terminals T1, T3, T5 and T7 respectively via the first, third, fifth and seventh switches SW1, SW3, SW5 and SW7. That is, the switches SW1-SW7 are provided to parallel connect the detection targets A1-A6 to the capacitor CA and open and close electrical paths between the detection targets A1-A6 and the capacitor CA.

The output-side switch section 24 is provided between the capacitor section 23 and the voltage detection unit 25. The output-side switch section 24 includes switches SWA and SWB that are respectively connected with the first and second terminals N1 and N2 of the capacitor CA. Specifically, the switch SWA is connected with the first terminal N1 while the switch SWB is connected with the second terminal N2. The switches SWA and SWB are provided to open and close electrical paths between the capacitor CA and the voltage detection unit 25. In addition, each of the switches SWA and SWB may be implemented by, for example, a semiconductor switch such as an N-channel MOSFET.

The voltage detection unit 25 is provided between the output-side switch section 24 and the control unit 27. The voltage detection unit 25 is connected in parallel with the capacitor CA via the switches SWA and SWB. The voltage detection unit 25 is provided to detect the voltage of the capacitor CA. Specifically, though not shown in the figures, the voltage detection unit 25 includes a differential amplification circuit and an AD conversion circuit. The voltage detection unit 25 detects the voltage of the capacitor CA using the differential amplification circuit, and outputs the detected voltage to the control unit 27 through an AD conversion by the AD conversion circuit.

The control unit 27 is configured with a microcomputer which includes a CPU and a memory. The control unit 27 is provided to control the on/off of each of the switches SWn, the on/off of each of the switches SWA and SWB and voltage acquisition timings TD1 and TD2 (see FIG. 5) of the voltage detection unit 25. Specifically, the control unit 27 performs a voltage detection process which includes charge processes and acquisition processes. In each of the charge processes, with the capacitor CA and the voltage detection unit 25 electrically insulated from each other, the capacitor CA is charged using one of the detection targets A1-A6 of the assembled battery 10. In each of the acquisition processes, with the assembled battery 10 and the capacitor CA electrically insulated from each other, the voltage of one of the detection targets A1-A6, with which the capacitor CA has been charged in the charge process immediately before the acquisition process, is acquired based on the detected voltage outputted from the voltage detection unit 25.

Figure 2:
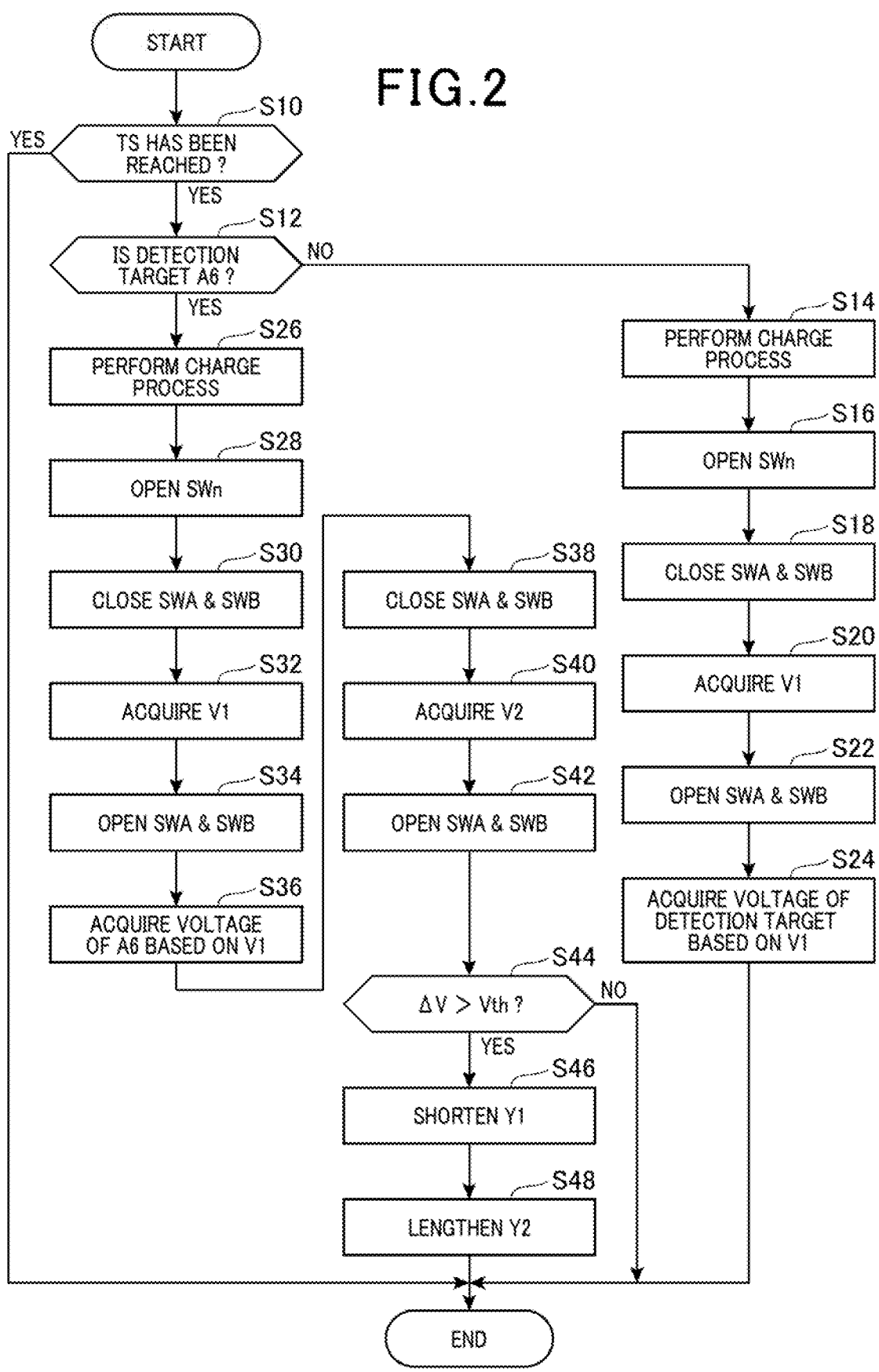
FIG. 2 is a flow chart illustrating a voltage detection process performed by a control unit of the voltage detection apparatus.

FIG. 2 illustrates the voltage detection process according to the present embodiment. This process is repeatedly performed by the control unit 27 in a predetermined cycle. In addition, at the start of the voltage detection process, all of the switches SWn and the switches SWA and SWB are in an open state (i.e., off-state).

In the voltage detection process, first, in step S10, it is determined whether one of predetermined processing timings TS has been reached. Each of the processing timings TS is predetermined, for a corresponding one of the detection targets A1-A6, as a timing for performing a first process or a second process for the corresponding detection target.

If the determination in step S10 results in a "NO" answer, the process directly terminates without performing the remaining steps.

In contrast, if the termination in step S10 results in a "YES" answer, the process proceeds to step S12.

In step S12, it is determined whether the current voltage detection target is the sixth detection target A6.

In addition, in the present embodiment, the sixth detection target A6 corresponds to a "specific detection target".

If the determination in step S12 results in a "NO" answer, i.e., if the current voltage detection target is one of the detection targets A1-A5, the process proceeds to step S12 to perform the first process for the current voltage detection target.

The first process includes the charge process for charging the capacitor CA with electric power stored in the current voltage detection target (i.e., one of the detection targets A1-A5), and the acquisition process for acquiring the voltage of the current voltage detection target by the voltage detection unit 25.

Hereinafter, for the sake of avoiding redundancy, explanation will be made only for the case of the current voltage detection target being, for example, the first detection target A1.

In step S14, the charge process is performed. Specifically, in the charge process, both the first and second switches SW1 and SW2, which are respectively connected with the first and second electrode terminals T1 and T2, are turned to a closed state (or on-state), thereby charging the capacitor CA with electric power stored in the first detection target A1. In addition, the first and second electrode terminals T1 and T2 are respectively connected with the positive and negative terminals of the first detection target A1.

After a predetermined charge period has elapsed, in step S16, both the first and second switches SW1 and SW2 (denoted by SWn in FIG. 2) are turned to the open state.

Upon turning both the first and second switches SW1 and SW2 to the open state, the acquisition process is performed. Specifically, in the acquisition process, before a predetermined first period Y1 has elapsed from the turning of both the first and second switches SW1 and SW2 to the open state, in step S18, both the switches SWA and SWB are turned to a closed state (or on-state), thereby allowing the voltage of the capacitor CA to be acquired by the voltage detection unit 25.

Figure 5:
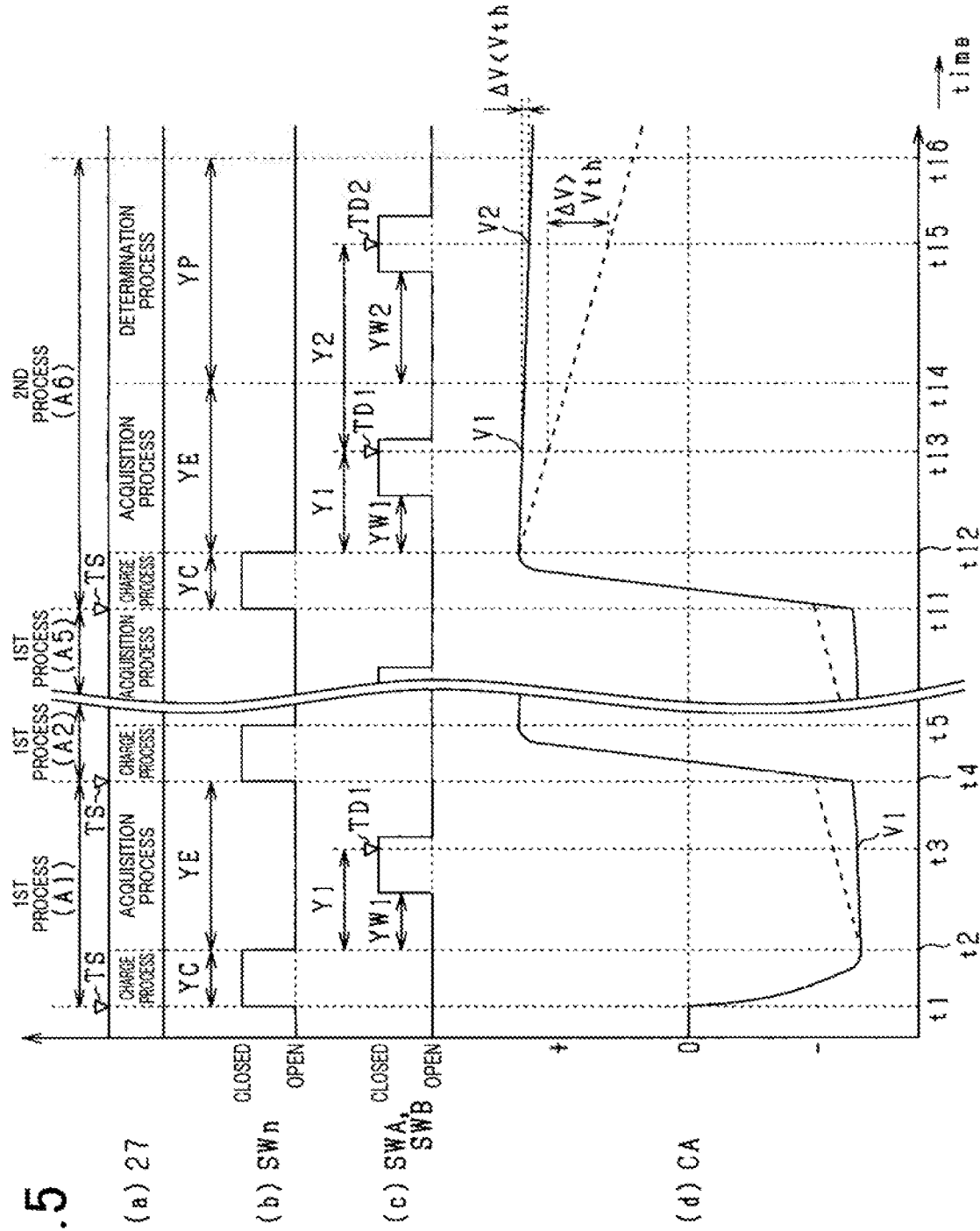
FIG. 5 is a time chart illustrating (a) change in the processes performed by the control unit, (b) change in the open/closed state of target switches, (c) change in the open/closed state of output-side switches and (d) change in the voltage of a capacitor of the voltage detection apparatus, all the changes being caused by execution of the voltage detection process by the control unit.

In step S20, at a first-voltage acquisition timing TD1 after the first period Y1 has elapsed from the turning of both the first and second switches SW1 and SW2 to the open state, the voltage of the capacitor CA is acquired as a first voltage V1 by the voltage detection unit 25 (see FIG. 5).

After the acquisition of the first voltage V1, in step S22, both the switches SWA and SWB are turned to the open state.

In step S24, the voltage of the first detection target A1 is acquired based on the first voltage V1 acquired in step S20. Then, the voltage detection process terminates.

On the other hand, if the determination in step S12 results in a "YES" answer, i.e., if the current voltage detection target is the sixth detection target A6, the process proceeds to step S26 to perform the second process.

The second process includes the charge process for charging the capacitor CA with electric power stored in the sixth detection target A6, the acquisition process for acquiring the voltage of the sixth detection target A6 by the voltage detection unit 25, and a determination process for determining whether a leak fault has occurred in the capacitor CA.

In step S26, the charge process is performed. Specifically, in the charge process, both the sixth and seventh switches SW6 and SW7, which are respectively connected with the sixth and seventh electrode terminals T6 and T7, are turned to a closed state (or on-state), thereby charging the capacitor CA with electric power stored in the sixth detection target A6. In addition, the sixth and seventh electrode terminals T6 and T7 are respectively connected with the positive and negative terminals of the sixth detection target A6.

After a predetermined charge period has elapsed, in step S28, both the sixth and seventh switches SW6 and SW7 (denoted by SWn in FIG. 2) are turned to the open state.

Upon turning both the sixth and seventh switches SW6 and SW7 to the open state, the acquisition process is performed. Specifically, in the acquisition process, before a predetermined first period Y1 has elapsed from the turning of both the sixth and seventh switches SW6 and SW7 to the open state, in step S30, both the switches SWA and SWB are turned to the closed state, thereby allowing the voltage of the capacitor CA to be acquired by the voltage detection unit 25.

In step S32, at a first-voltage acquisition timing TD1 after the first period Y1 has elapsed from the turning of both the sixth and seventh switches SW6 and SW7 to the open state, the voltage of the capacitor CA is acquired as the first voltage V1 by the voltage detection unit 25 (see FIG. 5).

After the acquisition of the first voltage V1, in step S34, both the switches SWA and SWB are turned to the open state.

In step S36, the voltage of the sixth detection target A6 is acquired based on the first voltage V1 acquired in step S32. Then, the process proceeds to step S38.

In addition, in the present embodiment, the control unit 27 functions as a "capacitor charging unit" to perform above step S26, as a "first-voltage acquiring unit" to perform above step S32, and as a "a detection-target voltage acquiring unit" to perform above step S36.

After the acquisition of the voltage of the sixth detection target A6 in step S36, the determination process is performed to determine whether a leak fault has occurred in the capacitor CA.

Specifically, in step S38, before a predetermined second period Y2 has elapsed from the acquisition of the first voltage V1 in step S32, both the switches SWA and SWB are turned to the closed state.

Then, in step S40, at a second-voltage acquisition timing TD2 after the second period Y2 has elapsed from the acquisition of the first voltage V1 in step S32, the voltage of the capacitor CA is acquired as a second voltage V2 by the voltage detection unit 25 (see FIG. 5).

After the acquisition of the second voltage V2, in step S42, both the switches SWA and SWB are turned to the open state.

In addition, in the present embodiment, the control unit 27 functions as a "switch-state control unit" to perform above steps S34 and S38, and as a "second-voltage acquiring unit" to perform above step S40.

In step S44, based on both the first voltage V1 acquired in step S32 and the second voltage V2 acquired in step S40, it is determined whether a leak fault has occurred in the capacitor CA.

Specifically, in this step, a voltage difference $\Delta V$ between the first voltage V1 and the second voltage V2 is calculated by the following Equation 1. Then, it is determined whether the voltage difference $\Delta V$ is larger than a preset threshold value Vth.

$$\Delta V = |V1 - V2| \quad \text{(Equation 1)}$$

In addition, in the present embodiment, the control unit 27 functions as "fault determining unit" to perform above step S44.

The threshold value Vth is preset to an amount of decrease in the voltage of the capacitor CA which may be caused, when no leak fault has occurred in the capacitor CA, by natural discharge of the capacitor CA during the second period Y2. More particularly, the threshold value Vth is preset to the maximum amount of decrease in the voltage of the capacitor CA which may be caused by natural discharge of the capacitor CA during the second period Y2.

Figure 3:
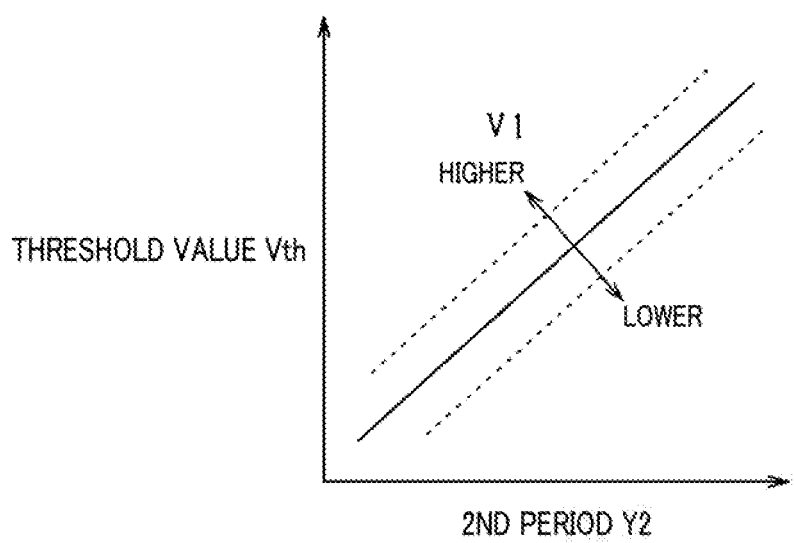
FIG. 3 is a graphical representation illustrating the relationship between a second period, a first voltage and a threshold value.

In the present embodiment, the threshold value Vth is preset based on both the first voltage V1 acquired in step S32 and the second period Y2. FIG. 3 illustrates the relationship between the second period Y2, the first voltage V1 and the threshold value Vth. As shown in FIG. 3, the longer the second period Y2, the larger the threshold value Vth is preset to be; the higher the first voltage V1, the larger the threshold value Vth is preset to be.

When the voltage difference ΔV is not larger than the threshold value Vth, it is determined that no leak fault has occurred in the capacitor CA. That is, the determination in step S44 results in a "NO" answer. In this case, the process directly terminates without performing the remaining steps.

In contrast, when the voltage difference ΔV is larger than the threshold value Vth, it is determined that a leak fault has occurred in the capacitor CA. That is, the determination in step S44 results in a "YES" answer. In this case, the process proceeds to step S46.

In step S46, the first period Y1 is shortened in comparison with the case where it is determined that no leak fault has occurred in the capacitor CA. That is, the time period from the turning of both the sixth and seventh switches SW6 and SW7 to the open state to the acquisition of the first voltage V1 is shortened.

In addition, in the present embodiment, the control unit 27 functions as a "first-period setting unit" to perform above step S46.

In subsequent step S48, the second period Y2 is lengthened in comparison with the case where it is determined that no leak fault has occurred in the capacitor CA. That is, the time period from the acquisition of the first voltage V1 to the acquisition of the second voltage V2 is lengthened. Then, the voltage detection process terminates.

In addition, in the present embodiment, the control unit 27 functions as a "second-period setting unit" to perform above step S48.

Moreover, in the case where steps S46 and S48 have been performed in the previous execution of the voltage detection process, instead of performing steps S46 and S48 in the present execution of the voltage detection process, a determination is made, based on the voltage difference ΔV, as to whether it is necessary to replace the capacitor CA.

Figure 4:
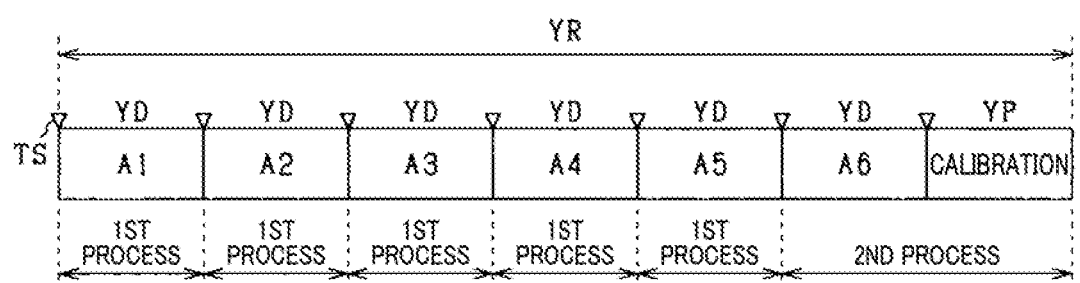
FIG. 4 is a schematic diagram illustrating the time schedule of the voltage detection process.

FIG. 4 illustrates the time schedule of the voltage detection process according to the present embodiment.

As shown in FIG. 4, in the voltage detection process according to the present embodiment, the voltages of the first to the sixth detection targets A1-A6 are sequentially acquired in this order and then the voltage detection unit 25 is calibrated. Specifically, in the calibration of the voltage detection unit 25, the offset of a reference voltage inputted to the differential amplification circuit included in the voltage detection unit 25 is calibrated. Therefore, the processing period YR for performing the voltage detection process includes six detection periods YD and one calibration period YP. The processing period YR is, for example, several tens of milliseconds.

The start timing of each of the detection periods YD is the processing timing TS. For each of the first to the fifth detection targets A1-A5, upon reaching the processing timing TS, the first process is performed within the corresponding detection period YD. On the other hand, for the sixth detection target A6, upon reaching the processing timing TS, the second process is performed within the corresponding detection period YD and the subsequent calibration period YP.

In the present embodiment, the second process is performed utilizing the calibration period YP. Consequently, it becomes possible to suppress the processing period YR from being extended due to the execution of the second process.

Of the time schedule of the voltage detection process shown in FIG. 4, the first process performed for the first detection target A1 and the second process performed for the sixth detection target A6 are shown in FIG. 5.

FIG. 5 is a time chart illustrating: (a) change in the processes performed by the control unit 27; (b) change in the open/closed state of target switches SWn (i.e., those of the first to the seventh switches SW1-SW7 which are closed and opened in the corresponding charge processes); (c) change in the open/closed state of the switches SWA and SWB; and (d) change in the voltage of the capacitor CA.

It should be noted that the voltage of the capacitor CA shown in FIG. 5(d) is represented by the relative electric potential of the first terminal N1 to the second terminal N2 of the capacitor CA. Therefore, the voltage of the capacitor CA shown in FIG. 5(d) takes a positive value when the electric potential of the first terminal N1 is higher than the electric potential of the second terminal N2, and a negative value when the electric potential of the first terminal N1 is lower than the electric potential of the second terminal N2.

In addition, in FIG. 5(d), change in the voltage of the capacitor CA when no leak fault has occurred in the capacitor CA is shown with a solid line whereas change in the voltage of the capacitor CA when a leak fault has occurred in the capacitor CA is shown with a dashed line.

As shown in FIG. 5(a), upon start of the first process for the first detection target A1 at a timing t1, the charge process is first performed using the first detection target A1 during the charge period YC.

Specifically, as shown in FIG. 5(b), the target switches SWn for the first detection target A1 (i.e., the first and second switches SW1 and SW2) are turned to the closed state. Consequently, as shown in FIG. 5(d), the capacitor CA is charged by the first detection target A1 so that the voltage of the capacitor CA takes a negative value corresponding to the voltage of the first detection target A1.

Upon the passage of the charge period YC, the target switches SWn are turned to the open state at a timing t2. Then, in the subsequent acquisition period YE, the acquisition process is performed using the voltage detection unit 25.

Specifically, as shown in FIG. 5(c), upon the passage of a predetermined first waiting period YW1 from the timing t2, both the switches SWA and SWB are turned to the closed state.

In addition, by providing the first waiting period YW1 in the voltage detection process, it becomes possible to prevent the occurrence of a situation where all of the target switches SWn and the switches SWA and SWB are in the closed state; consequently, it becomes possible to prevent overcurrent from flowing to the voltage detection unit 25.

At a timing t3 which is the first-voltage acquisition timing TD1 after the passage of the first period Y1 (Y1>YW1) from the turning of the target switches SWn (i.e., the first and second switches SW1 and SW2) to the open state, the voltage of the capacitor CA is acquired as the first voltage V1.

After the acquisition of the first voltage V1 at the timing t3, both the switches SWA and SWB are turned to the open state. Thereafter, upon the passage of the acquisition period YE, at a timing t4, the first process for the first detection target A1 and thus the detection period YD corresponding to the first detection target A1 terminate. That is, the charge period YC plus the acquisition period YE constitutes the detection period YD.

Moreover, upon start of the second process for the sixth detection target A6 at a timing t11, the charge process is first performed using the sixth detection target A6 during the charge period YC.

Specifically, as shown in FIG. 5(b), the target switches SWn for the sixth detection target A6 (i.e., the sixth and seventh switches SW6 and SW7) are turned to the closed state. Consequently, as shown in FIG. 5(d), the capacitor CA is charged by the sixth detection target A6 so that the voltage of the capacitor CA takes a positive value corresponding to the voltage of the sixth detection target A6.

Upon the passage of the charge period YC, the target switches SWn are turned to the open state at a timing t12. Then, in the subsequent acquisition period YE, the acquisition process is performed using the voltage detection unit 25.

Specifically, as shown in FIG. 5(c), upon the passage of a predetermined first waiting period YW1 from the timing t12, both the switches SWA and SWB are turned to the closed state.

Then, at a timing t13 which is the first-voltage acquisition timing TD1 after the passage of the first period Y1 (Y1>YW1) from the turning of the target switches SWn (i.e., the sixth and seventh switches SW6 and SW7) to the open state, the voltage of the capacitor CA is acquired as the first voltage V1.

After the acquisition of the first voltage V1 at the timing t13, both the switches SWA and SWB are turned to the open state. Thereafter, upon the passage of the acquisition period YE, at a timing t14, the detection period YD corresponding to the sixth detection target A6 terminates. That is, the charge period YC plus the acquisition period YE constitutes the detection period YD.

Upon the termination of the detection period YD corresponding to the sixth detection target A6, the determination process is performed during the calibration period YP.

Specifically, upon the passage of a predetermined second waiting period YW2 from the timing t14, both the switches SWA and SWB are again turned to the closed state.

Then, at a timing t15 which is the second-voltage acquisition timing TD2 after the passage of the second period Y2 from the acquisition of the first voltage V1 at the timing t13, the voltage of the capacitor CA is acquired as the second voltage V2.

After the acquisition of the second voltage V2 at the timing t15, both the switches SWA and SWB are turned to the open state. Thereafter, upon the passage of the calibration period YP, at a timing t16, the second process for the sixth detection target A6 and thus the entire voltage detection process terminate.

As shown in FIG. 5(b), in the voltage detection process according to the present embodiment, during the acquisition periods YE and the calibration period YP, the target switches SWn are kept in the open state. Consequently, it becomes possible to prevent electric charge, which has been charged into the capacitor CA during the charge periods YC, from being discharged to the assembled battery 10 side during the acquisition periods YE and the calibration period YP.

Moreover, as shown in FIG. 5(c), in the voltage detection process according to the present embodiment, during the acquisition periods YE and the calibration period YP, the on-periods, for which both the switches SWA and SWB are kept in the closed state, are limited, more specifically limited to predetermined periods respectively around the voltage acquisition timings TD1 and TD2. Consequently, it becomes possible to suppress electric charge, which has been charged into the capacitor CA during the charge periods YC, from being discharged to the voltage detection unit 25 side during the acquisition periods YE and the calibration period YP.

In particular, in the second process performed for the sixth detection target A6, during the second period Y2 from the acquisition of the first voltage V1 to the acquisition of the second voltage V2, both the switches SWA and SWB are turned to the open state. Consequently, as shown with a solid line in FIG. 5(d), when no leak fault has occurred in the capacitor CA, the capacitor CA is in a high-impedance state during the second period Y2. As a result, during the second period Y2, the voltage of the capacitor CA is kept approximately constant and thus the voltage difference ΔV between the first voltage V1 and the second voltage V2 becomes smaller than the threshold value Vth.

In contrast, as shown with a dashed line in FIG. 5(d), when a leak fault has occurred in the capacitor CA, the voltage of the capacitor CA considerably decreases due to the leak discharge from the capacitor CA and thus the voltage difference ΔV becomes larger than the threshold value Vth. Therefore, it is possible to determine, through comparison between the voltage difference ΔV and the threshold value Vth, whether a leak fault has occurred in the capacitor CA.

When a leak fault has occurred in the capacitor CA, the first voltages V1 acquired at the first-voltage acquisition timings TD1 are lowered and thus the acquired voltages of the detection targets A1-A6 become lower than the actual voltages of the same. Moreover, when the acquired voltages of the detection targets A1-A6 become lower than the actual voltages of the same, the SOCs (States of Charge) of the detection targets A1-A6 will be estimated to be lower than the actual values thereof, making it impossible to use up the electric power stored in the detection targets A1-A6. In view of the above, in the voltage detection process according to the present embodiment, when a leak fault has occurred in the capacitor CA, the first-voltage acquisition timings TD1 for acquiring the first voltages V1 are advanced.

Figure 6:
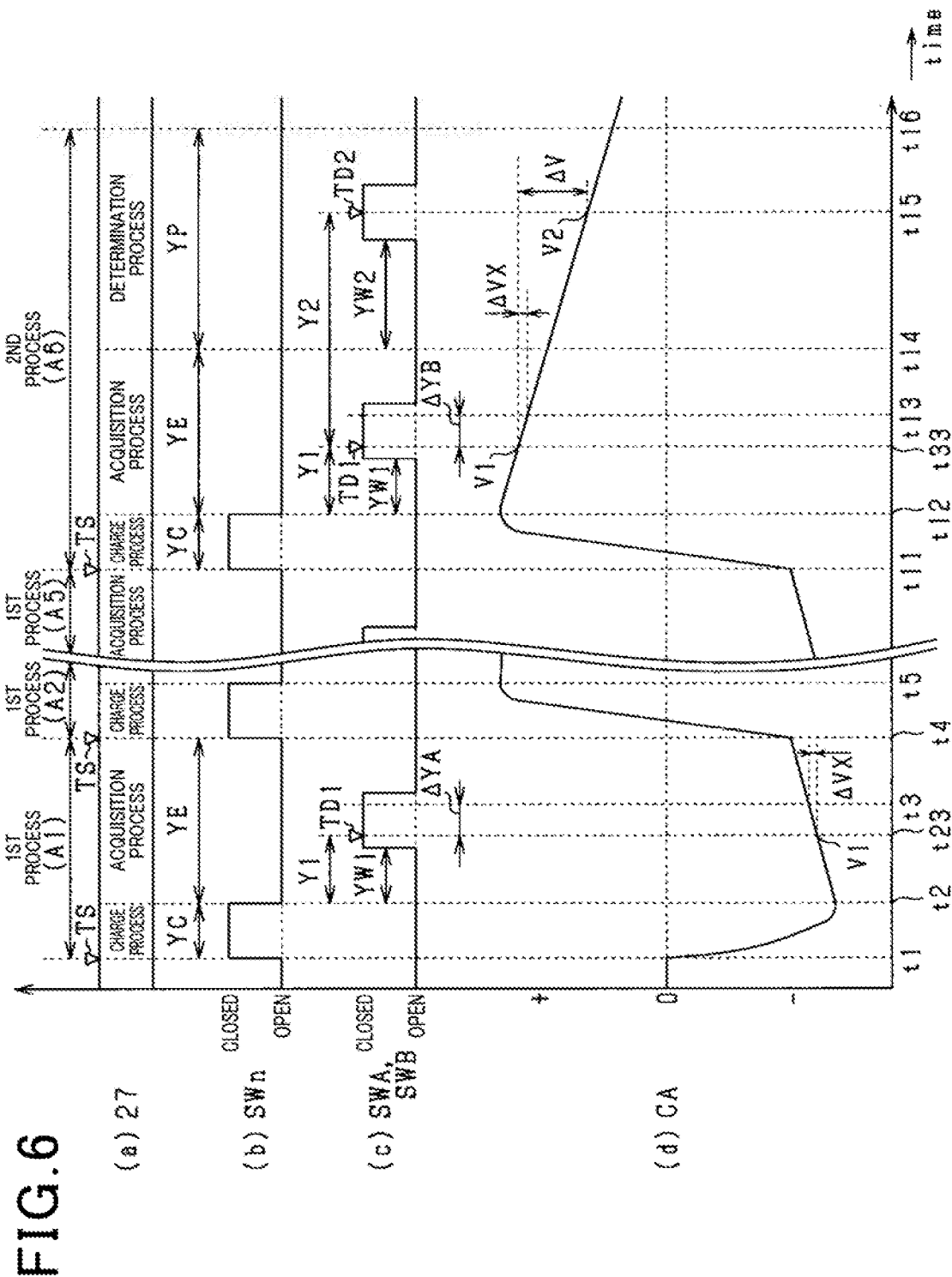
FIG. 6 is a time chart illustrating the advancing of first-voltage acquisition timings in the voltage detection process when a leak fault has occurred in the capacitor.

FIG. 6 is a time chart illustrating the advancing of the first-voltage acquisition timings TD1 when a leak fault has occurred in the capacitor CA. In addition, FIG. 6(a)-(d) are respectively similar to the above-described FIG. 5(a)-(d) and thus will not be described in detail hereinafter.

As shown in FIG. 6(c), in the first process for the first detection target A1, the first-voltage acquisition timing TD1 is advanced from the timing t3 to a timing t23. That is, the first period Y1 is shortened by advancing the first-voltage acquisition timing TD1.

In addition, the timing t23 is a timing after the passage of the first waiting period YW1 from the timing t2. Therefore, at the timing t23, both the switches SWA and SWB have already been turned to the closed state. In the present embodiment, when a leak fault has occurred in the capacitor CA, the first-voltage acquisition timings TD1 for acquiring the first voltages V1 are advanced while the timings of closing and opening the switches SWA and SWB are kept unchanged.

Similarly, in the second process for the sixth detection target A6, the first-voltage acquisition timing TD1 is advanced from the timing t13 to a timing t33. That is, the first period Y1 is shortened by advancing the first-voltage acquisition timing TD1. In addition, the time difference ΔYA between the timing T23 and the timing t3 is equal to the time difference ΔYB between the timing T33 and the timing t13.

Consequently, as shown in FIG. 6(d), the absolute values of the first voltages V1 acquired at the first-voltage acquisition timings TD1 are increased by a difference value ΔVX in comparison with the case of the first voltages V1 being acquired without advancing the first-voltage acquisition timings TD1. As a result, it becomes possible to suppress decrease in the estimation accuracy of the SOCs of the detection targets A1-A6 during the time period from the occurrence of a leak fault of the capacitor CA to the replacement of the capacitor CA. Accordingly, the advancing of the first-voltage acquisition timings TD1 when a leak fault has occurred in the capacitor CA is advantageous in terms of using up the electric power stored in the assembled battery 10.

On the other hand, in the second process for the sixth detection target A6, the second-voltage acquisition timing TD2 is kept unchanged at the timing t15. That is, the second period Y2 is lengthened by advancing the first-voltage acquisition timing TD1 while keeping the second-voltage acquisition timing TD2 unchanged. Consequently, as shown in FIG. 6(d), the voltage difference ΔV between the first voltage V1 and the second voltage V2 is increased by the difference value ΔVX in comparison with the case of the first voltage V1 being acquired without advancing the first-voltage acquisition timing TD1. Moreover, with increase in the voltage difference ΔV, a leak degree RD can be more accurately estimated. Here, the leak degree RD denotes the amount of increase in the voltage difference ΔV per unit time. The leak degree RD can be expressed by the following Equation 2.

$$RD = \Delta V / Y2 \qquad \text{(Equation 2)}$$

The leak degree RD represents the degree of the leak fault of the capacitor CA. The leak degree RD is proportional to the amount of leak discharge QR from the capacitor CA per unit time.

Figure 7:
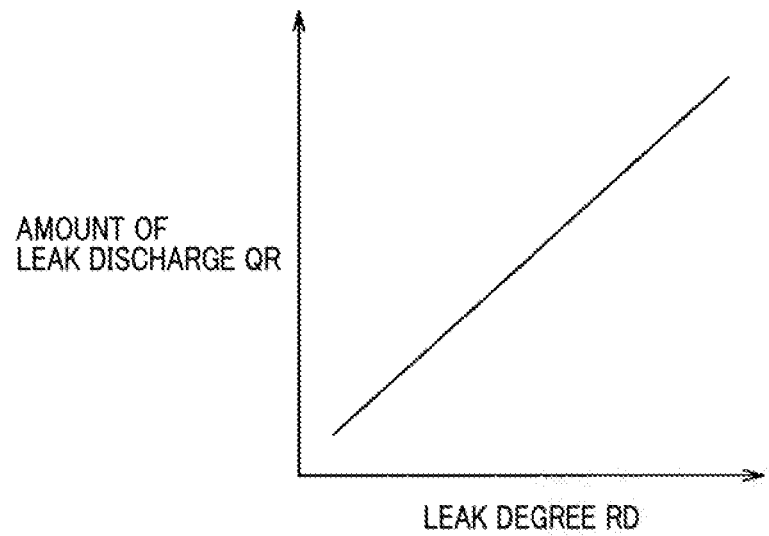
FIG. 7 is a graphical representation illustrating the relationship between the leak degree of the capacitor and the amount of leak discharge from the capacitor per unit time.

FIG. 7 illustrates the relationship between the leak degree RD and the amount of leak discharge QR from the capacitor CA per unit time. As seen from FIG. 7, the amount of leak discharge QR increases with the leak degree RD. Therefore, by accurately estimating the leak degree RD, it is possible to suitably determine, based on the estimated leak degree RD, whether it is necessary to replace the capacitor CA.

According to the present embodiment, it is possible to achieve the following advantageous effects.

In the present embodiment, the voltage of the capacitor CA, which has been charged with electric power stored in the sixth detection target A6, is first acquired as the first voltage V1 at the first-voltage acquisition timing TD1 and then acquired as the second voltage V2 at the second-voltage acquisition timing TD2. Based on the acquired first and second voltages V1 and V2, it is determined whether a leak fault has occurred in the capacitor CA. That is, the leak fault determination is made for the capacitor CA using the capacitor CA itself. Consequently, it becomes possible to suitably make the leak fault determination for the capacitor CA even though the flying-capacitor type voltage detection apparatus 20 includes only the single capacitor CA.

In the present embodiment, during the second period Y2, both the switches SWA and SWB are turned to the open state, thereby suppressing discharge from the capacitor CA to the voltage detection unit 25 side. That is, any discharge from the capacitor CA other than leak discharge is suppressed. Consequently, it becomes possible to accurately determine whether a leak fault has occurred in the capacitor CA.

When a leak fault has occurred in the capacitor CA, the higher the first voltage V1 and the longer the second period Y2, the larger the amount of leak discharge QR from the capacitor CA per unit time and thus the larger the voltage difference ΔV between the first and second voltages V1 and V2. In view of the above, in the present embodiment, the threshold value Vth, which is used in the leak fault determination for the capacitor CA, is preset based on both the first voltage V1 and the second period Y2. Consequently, it becomes possible to more accurately make the leak fault determination for the capacitor CA than in the case of presetting the threshold value Vth to a constant value regardless of the first voltage V1 and the second period Y2.

In the present embodiment, in the second process for the sixth detection target A6, the voltage of the sixth detection target A6 is acquired (or determined) based on the first voltage V1 that has been acquired for making the leak fault determination for the capacitor CA. Therefore, it is unnecessary to further acquire, in addition to the first and second voltages V1 and V2, the voltage of the capacitor CA for the purpose of acquiring the voltage of the sixth detection target A6. Consequently, it becomes possible to simplify control of the entire voltage detection apparatus 20.

When a leak fault has occurred in the capacitor CA, in the second process for the sixth detection target A6, the shorter the first period Y1, the smaller the amount of leak discharge QR from the capacitor CA per unit time and thus the less the influence of the leak fault on the acquired voltage of the sixth detection target A6. In view of the above, in the present embodiment, the first period Y1 is shortened when it is determined that a leak fault has occurred in the capacitor CA. Consequently, it becomes possible to more accurately acquire the voltage of the sixth detection target A6; thus it also becomes possible to more accurately estimate the SOC of the sixth detection target A6 on the basis of the acquired voltage of the sixth detection target A6.

When a leak fault has occurred in the capacitor CA, in the second process for the sixth detection target A6, the longer the second period Y2, the larger the amount of leak discharge QR from the capacitor CA per unit time and thus the higher the accuracy of estimation of the leak degree RD of the capacitor CA based on the amount of leak discharge QR. In view of the above, in the present embodiment, the second period Y2 is lengthened when it is determined that a leak fault has occurred in the capacitor CA. Consequently, it becomes possible to more accurately estimate the leak degree RD of the capacitor CA; thus it also becomes possible to more suitably determine, based on the estimated leak degree RD, whether it is necessary to replace the capacitor CA.

Specifically, when the leak degree RD of the capacitor CA is low, it may be considered that no leak fault has occurred in the capacitor CA, but only small leak has occurred in the capacitor CA due to, for example, temporary condensation of water vapor. In this case, instead of replacing the capacitor CA, a predetermined leak correction may be made when acquiring the voltages of the detection targets A1-A6 based on the respective first voltages V1.

Moreover, even when the leak degree RD of the capacitor CA is high, if the leak degree RD is stable, it is still possible to make, without replacing the capacitor CA, the predetermined leak correction according to the leak degree RD when acquiring the voltages of the detection targets A1-A6 based on the respective first voltages V1. Consequently, it becomes possible to use the assembled battery 10 until replacement of the capacitor CA due to a leak fault occurring therein.

Second Embodiment

A voltage detection apparatus 20 according to the second embodiment has a similar configuration to the voltage detection apparatus 20 according to the first embodiment. Accordingly, the differences therebetween will be mainly described hereinafter.

In the voltage detection apparatus 20 according to the first embodiment, the capacitor section 23 includes only the single capacitor CA (see FIG. 1).

Figure 8:
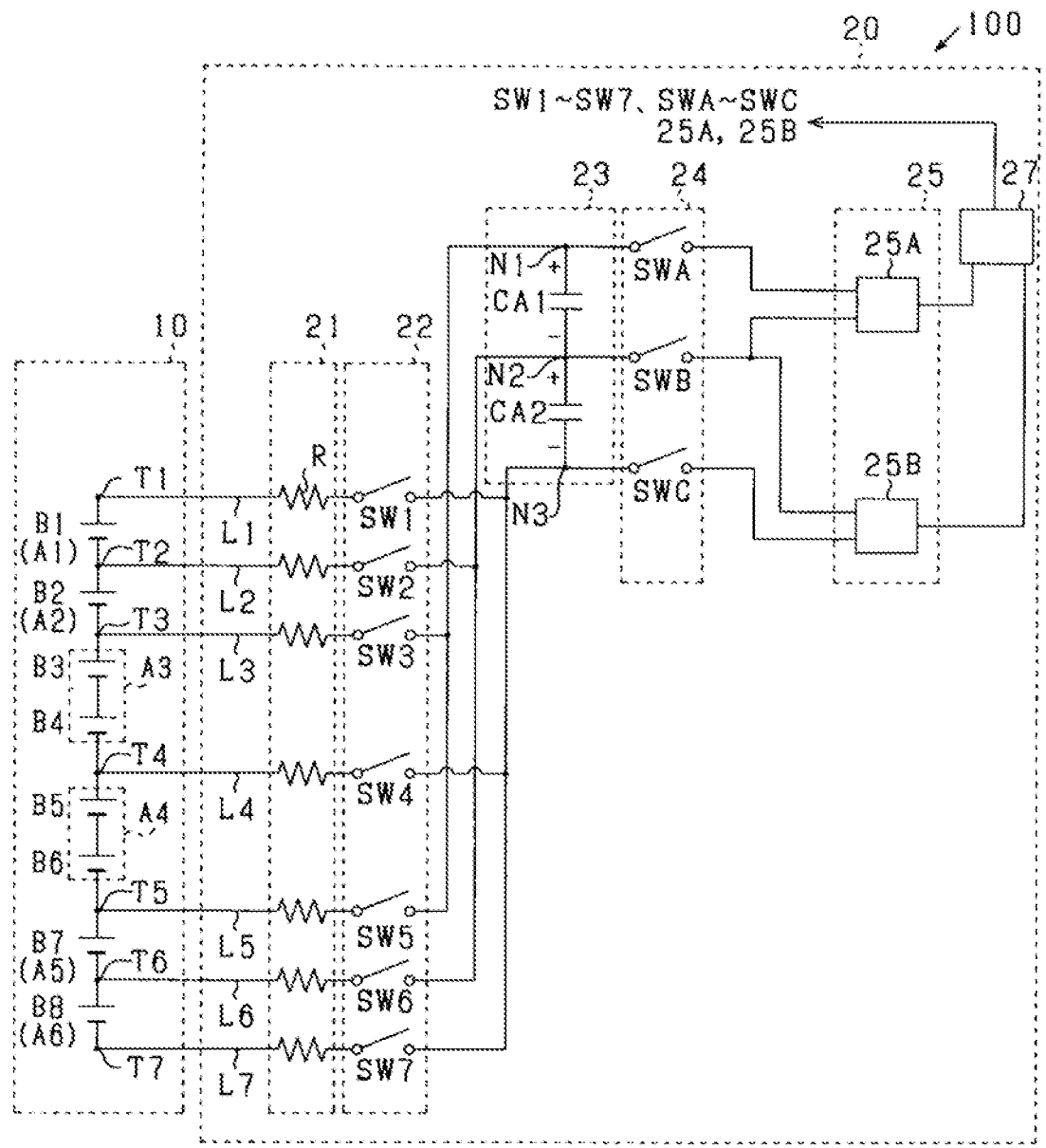
FIG. 8 is a schematic diagram illustrating the overall configuration of an electric power supply system which includes a voltage detection apparatus according to a second embodiment.

In contrast, in the voltage detection apparatus 20 according to the present embodiment, as shown in FIG. 8, the capacitor section 23 includes a serially-connected capacitor pair consisting of a first capacitor CA1 and a second capacitor CA2.

Moreover, in the present embodiment, a first terminal N1 is provided as a connection terminal at one end of the serially-connected capacitor pair. A second terminal N2 is provided as a connection terminal between the first capacitor CA1 and the second capacitor CA2. A third terminal N3 is provided as a connection terminal at the other end of the serially-connected capacitor pair.

Each of the electrode terminals Tn of the assembled battery 10 is connected with one of the first, second and third terminals N1, N2 and N3 via a corresponding one of the switches SWn.

Specifically, to the first terminal N1, there are connected the third and fifth electrode terminals T3 and T5 respectively via the third and fifth switches SW3 and SW5. To the second terminal N2, there are connected the second and sixth electrode terminals T2 and T6 respectively via the second and sixth switches SW2 and SW6. To the third terminal N3, there are connected the first, fourth and seventh electrode terminals T1, T4 and T7 respectively via the first, fourth and seventh switches SW1, SW4 and SW7.

The output-side switch section 24 includes three switches SWA, SWB and SWC that are respectively connected with the first, second and third terminals N1, N2 and N3 of the serially-connected capacitor pair consisting of the first and second capacitors CA1 and CA2.

Moreover, in the present embodiment, the voltage detection unit 25 includes a first voltage detection unit 25A and a second voltage detection unit 25B. The first voltage detection unit 25A is connected with the first capacitor CA1 to detect the voltage of the first capacitor CAL The second voltage detection unit 25B is connected with the second capacitor CA2 to detect the voltage of the second capacitor CA2.

The switches SWA and SWB are provided to open and close electrical paths between the first capacitor CA1 and the first voltage detection unit 25A. The switches SWB and SWC are provided to open and close electrical paths between the second capacitor CA2 and the second voltage detection unit 25B. Specifically, the switch SWA is connected between the first terminal N1 and the first voltage detection unit 25A. The switch SWB is connected between the second terminal N2 and both the first and second voltage detection units 25A and 25B. The switch SWC is connected between the third terminal N3 and the second voltage detection unit 25B.

The control unit 27 is provided to control the on/off of each of the switches SWn, the on/off of each of the switches SWA, SWB and SWC, and voltage acquisition timings TD1 and TD2 of the first and second voltage detection units 25A and 25B.

Figure 9:
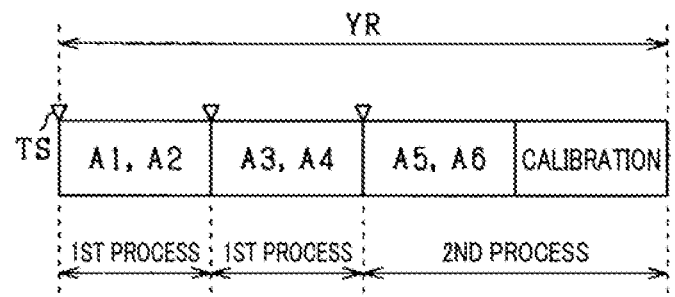
FIG. 9 is a schematic diagram illustrating the time schedule of a voltage detection process performed by a control unit of the voltage detection apparatus according to the second embodiment.

Specifically, in the present embodiment, the control unit 27 performs a voltage detection process which includes, as shown in FIG. 9, a first process for acquiring the voltages of the first and second detection targets A1 and A2, a first process for acquiring the voltages of the third and fourth detection targets A3 and A4, and a second process for acquiring the voltages of the fifth and sixth detection targets A5 and A6 and calibrating the first and second voltage detection units 25A and 25B.

Specifically, in the voltage detection process according to the present embodiment, first, the voltages of the first and second detection targets A1 and A2 are simultaneously acquired using the first and second capacitors CA1 and CA2. Then, the voltages of the third and fourth detection targets A3 and A4 are simultaneously acquired using the first and second capacitors CA1 and CA2. Thereafter, the voltages of the fifth and sixth detection targets A5 and A6 are simultaneously acquired using the first and second capacitors CA1 and CA2. After the acquisition of the voltages of all the detection targets A1-A6, both the first and second voltage detection units 25A and 25B are calibrated.

That is, the voltage detection apparatus 20 according to the present embodiment is a single flying-capacitor type voltage detection apparatus which includes the serially-connected capacitor pair consisting of the first and second capacitors CA1 and CA2.

In the present embodiment, the first process is performed for both the first and second detection targets A1 and A2 during a corresponding detection period YD. Then, the first process is performed for both the third and fourth detection targets A3 and A4 during a corresponding detection period YD. Thereafter, the second process is performed for both the fifth and sixth detection targets A5 and A6 during a corresponding detection period YD and a subsequent calibration period YP.

Specifically, in the second process, first and second voltages V1 and V2, which are voltages of the first capacitor CA1 corresponding to the voltage of the fifth detection target A5, are acquired respectively at a first-voltage acquisition timing TD1 and a second-voltage acquisition timing TD2; then, based on the acquired first and second voltages V1 and V2, it is determined whether a leak fault has occurred in the first capacitor CAL Meanwhile, first and second voltages V1 and V2, which are voltages of the second capacitor CA2 corresponding to the voltage of the sixth detection target A6, are acquired respectively at the first-voltage acquisition timing TD1 and the second-voltage acquisition timing TD2; then, based on the acquired first and second voltages V1 and V2, it is determined whether a leak fault has occurred in the second capacitor CA2.

As described above, the voltage detection apparatus 20 according to the present embodiment includes the first and second capacitors CA1 and CA2. The leak fault determination is made for the first capacitor CA1 using the first capacitor CA1 itself; at the same time, the leak fault determination is also made for the second capacitor CA2 using the second capacitor CA2 itself. Consequently, it becomes possible to suitably make the leak fault determination for each of the capacitors CA1 and CA2 regardless of the number of the capacitors included in the voltage detection apparatus 20.

While the above particular embodiments have been shown and described, it will be understood by those skilled in the art that various modifications, changes and improvements may be made without departing from the spirit of the present disclosure.

(1) In the above-described embodiments, the assembled battery 10 has the eight battery modules B electrically connected in series with each other.

However, the number of the battery modules B included in the assembled battery 10 is not limited to eight, but may alternatively be greater than or equal to two and less than eight, or greater than or equal to nine.

(2) In the above-described embodiments, of the six detection targets A1-A6, the third and fourth detection targets A3 and A4 each include two battery modules B while the other detection targets A1, A2, A5 and A6 each include only a single battery module B. As an alternative, all the detection targets A1-A6 may each include only a single battery module B.

(3) In the above-described embodiments, each of the detection lines Ln has one current-limiting resistor R provided thereon. As an alternative, each of the detection lines Ln may have no current-limiting resistor R provided thereon.

(4) In the above-described first embodiment, when it is determined that a leak fault has occurred in the capacitor CA, in each of the first and second processes, the first period Y1 is shortened by advancing the first-voltage acquisition timing TD1 while keeping the timings of closing and opening the switches SWA and SWB unchanged (see FIG. 6).

Figure 10:
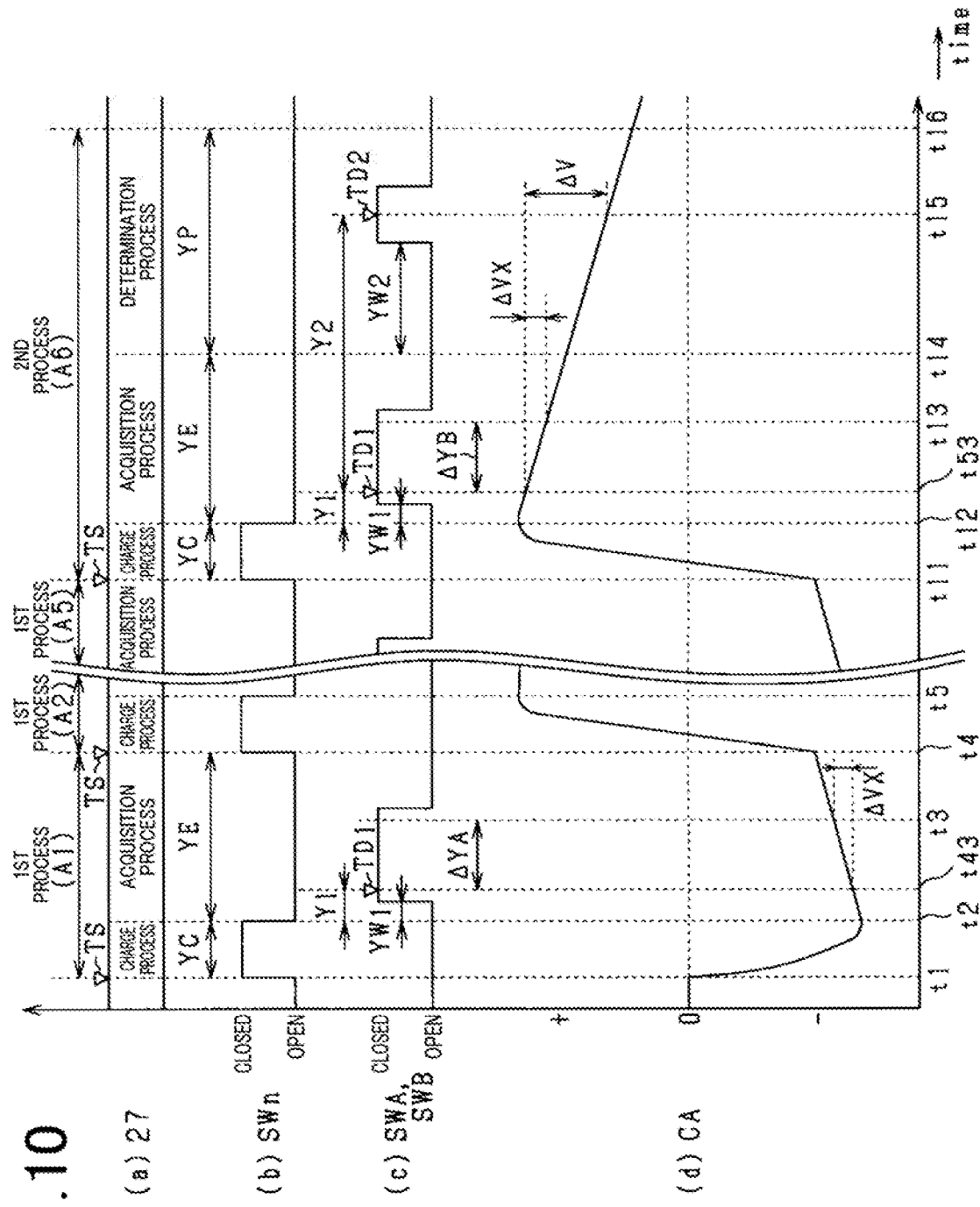
FIG. 10 is a time chart illustrating a voltage detection process according to a modification.

As an alternative, as shown in FIG. 10, when it is determined that a leak fault has occurred in the capacitor CA, in each of the first and second processes, the first waiting period YW1 may be shortened to advance the timing of closing the switches SWA and SWB. Consequently, it becomes possible to further advance the first-voltage acquisition timing TD1 from the timing t23 or t33 shown in FIG. 6 to an earlier timing t43 or t53 shown in FIG. 10. As a result, it becomes possible to increase the absolute value of the first voltage V1 acquired at the first-voltage acquisition timing TD1, thereby more suitably suppressing decrease in the estimation accuracy of the SOC of the corresponding detection target.

(5) In the above-described first embodiment, when it is determined that a leak fault has occurred in the capacitor CA, in the second process, the second period Y2 is lengthened by advancing the first-voltage acquisition timing TD1 while keeping the second-voltage acquisition timing TD2 unchanged (see FIG. 6).

As an alternative, the second period Y2 may further be lengthened by delaying the second-voltage acquisition timing TD2. In this case, the second-voltage acquisition timing TD2 may be delayed by delaying the timing of opening the switches SWA and SWB after the acquisition of the second voltage V2.

(6) In the above-described first embodiment, the threshold value Vth used for the leak fault determination of the capacitor CA is preset based on both the first voltage V1 and the second period Y2. As an alternative, the threshold value Vth may be preset based on only the first voltage V1 or only the second period Y2. That is, the threshold value Vth may be preset based on at least one of the first voltage V1 and the second period Y2.

What is claimed is:

1. A voltage detection apparatus for an assembled battery, the assembled battery having a plurality of battery cells electrically connected in series with each other, the battery cells being divided into a plurality of detection targets, each of the detection targets including at least one of the battery cells,
the voltage detection apparatus comprising:
a capacitor;
input-side switches provided to parallel connect the detection targets to the capacitor and open and close electrical paths between the detection targets and the capacitor;
a voltage detection unit configured to detect a voltage of the capacitor;
output-side switches provided to open and close electrical paths between the capacitor and the voltage detection unit;
a capacitor charging unit configured to turn the output-side switches to an open state and those of the input-side switches which correspond to a specific detection target to a closed state and thereby charge the capacitor with electric power stored in the specific detection target, the specific detection target being one of the plurality of detection targets;
a first-voltage acquiring unit configured to turn, after the charging of the capacitor by the capacitor charging unit, the input-side switches corresponding to the specific detection target to an open state and the output-side switches to a closed state and thereby acquire a first voltage, the first voltage being the voltage of the capacitor after a first period has elapsed from the turning of the input-side switches corresponding to the specific detection target to the open state;
a second-voltage acquiring unit configured to acquire a second voltage, the second voltage being the voltage of the capacitor after a second period has elapsed from the acquisition of the first voltage by the first-voltage acquiring unit;
a fault determining unit configured to determine, based on the first voltage acquired by the first-voltage acquiring unit and the second voltage acquired by the second-voltage acquiring unit, whether a leak fault has occurred in the capacitor; and
a second-period setting unit configured to set the second period to be longer when it is determined by the fault determining unit that a leak fault has occurred in the capacitor than when it is determined that no leak fault has occurred in the capacitor.

2. The voltage detection apparatus as set forth in claim 1, further comprising a switch-state control unit configured to turn the output-side switches to the open state during the second period from the acquisition of the first voltage by the first-voltage acquiring unit to the acquisition of the second voltage by the second-voltage acquiring unit.

3. The voltage detection apparatus as set forth in claim 1, wherein the fault determining unit is configured to determine, when a voltage difference between the first voltage acquired by the first-voltage acquiring unit and the second voltage acquired by the second-voltage acquiring unit is larger than a preset threshold value, that a leak fault has occurred in the capacitor,
the threshold value being preset based on at least one of the first voltage acquired by the first-voltage acquiring unit and the second period.

4. The voltage detection apparatus as set forth in claim 1, further comprising a detection-target voltage acquiring unit configured to acquire a voltage of the specific detection target based on the first voltage acquired by the first-voltage acquiring unit.

5. The voltage detection apparatus as set forth in claim 4, further comprising a first-period setting unit configured to set the first period to be shorter when it is determined by the fault determining unit that a leak fault has occurred in the capacitor than when it is determined that no leak fault has occurred in the capacitor.

* * * * *